United States Patent [19]

Yazawa et al.

[11] Patent Number: 5,003,504
[45] Date of Patent: Mar. 26, 1991

[54] FM MODULATOR FOR AN INPUT IMPULSE SIGNAL

[75] Inventors: Akira Yazawa; Kenji Nakayama, both of Tokyo, Japan

[73] Assignee: NEC Corporation, Japan

[21] Appl. No.: 111,453

[22] Filed: Oct. 22, 1987

[30] Foreign Application Priority Data

Oct. 24, 1986 [JP] Japan ................ 61-254303

[51] Int. Cl.$^5$ .............................................. G06F 1/02
[52] U.S. Cl. .................................. 364/718; 364/721; 364/724.17; 328/14
[58] Field of Search ............... 364/721, 718, 724.17, 364/721, 718; 84/1.01, 1.24, 1.25, DIG. 10, 600, 602, 603, 622, 647, 659, 661; 328/14; 332/16 R, 117

[56] References Cited

U.S. PATENT DOCUMENTS

| | | | |
|---|---|---|---|
| 4,249,447 | 2/1981 | Tomisawa | 364/721 X |
| 4,422,156 | 12/1983 | Sano | 364/724.17 |
| 4,472,993 | 9/1984 | Futamase et al. | 84/1.24 |
| 4,580,237 | 4/1986 | Eggermont | 364/724.17 |
| 4,679,480 | 7/1987 | Suzuki | 84/DIG. 10 X |

OTHER PUBLICATIONS

Alles, Harold G., "Music Synthesis Using Real Time Digital Techniques", *Proc of the IEEE*, vol. 68, No. 4, Apr. 1980, pp. 436–449, Copy in 364/721.

Primary Examiner—Eugene R. Laroche
Assistant Examiner—Benny Lee
Attorney, Agent, or Firm—Leydig, Voit & Mayer

[57] ABSTRACT

An FM modulator comprises a first adder for adding an impulse input signal and a feedback signal to produce an added signal, a delay device for receiving and delaying the added signal to produce first and second delayed signals, a multiplying coefficient generator for producing multiplying coefficients, multiplier for multiplying the delayed signals by multiplying coefficients to produce first and second multiplied signals, and a second adder for adding the multiplied signals to produce the feedback signal. The added signal is a frequency modulation signal which may be further delayed and multiplied by multiplying coefficients. At lease one of the multiplying coefficients varies in its value as a function of time so that the frequency modulation signal is produced.

9 Claims, 2 Drawing Sheets

FM MODULATOR FOR AN INPUT IMPULSE SIGNAL

FIELD OF THE INVENTION

The invention relates to an FM modulator, and more particularly to an FM modulator in which a frequency modulation signal is produced in accordance with the processing of digital signals.

BACKGROUND OF THE INVENTION

One type of a conventional FM modulator comprises a ROM (Read Only Memory) for storing amplitude values of a quarter period of a sine wave at addresses based on phases thereof, and a signal processor for controlling the reading of a signal from the ROM. The FM modulator in which a frequency modulation signal is produced in accordance with the processing of digital signals can be applied to a sound source for a musical synthesizer.

A frequency modulation wave of a peak amplitude P is expressed in the equation (1), where the carrier and modulation wave are of a sine curve.

$$e(t) = P\sin(\alpha t + I\sin\beta t) \quad (1)$$

In the equation (1), e is the instantaneous amplitude of the modulated carrier, $\alpha$ is the carrier angular frequency in rad/s, I is the modulation index which is the ratio of the peak deviation to the modulating angular frequency, and $\beta$ is the modulating frequency.

In operation, a phase is calculated at a sampling time t in the signal processor in accordance with the equation (1) so that a stored signal is read from the ROM at an address thereof which corresponds to the calculated phase. Such signals are sequentially read from the ROM to produce a frequency modulation wave.

According to the conventional FM modulator, however, a large capacity of ROM is necessary to be included, when an interval of sampling times t is shortened. In such a case, an external ROM has been added to the signal processor because there is resulted a shortage in the storing capacity for an internal ROM of the signal processor. On the other hand, a general purpose signal processor is not generally adapted to use an external ROM. Therefore, a special purpose signal processor has been adapted in the conventional FM modulator.

Further, a supplemental calculation is performed to decrease a distortion of an output wave between sampled values. A system in which the supplemental calculation is performed is required to include a large scale of a signal processor as a hardware because a high speed summation and multiplication must be made therein.

SUMMARY OF THE INVENTION

Accordingly, it is an object of the invention to provide an FM modulator in which a memory for storing, for instance, a sine wave is not necessary to be included.

It is a further object of the invention to provide an FM modulator in which a large capacity of ROM is not required to be included.

It is a still further object of the invention to provide an FM modulator in which a frequency modulation wave is produced in accordance with only the processing of digital signals in a general purpose signal processor.

According to the invention, an FM modulation comprises,
 means for adding an input impulse signal and a feedback signals to produce a first signal,
 means for delaying the first signal predetermined, times to produce delayed signals, and
 a multiplying coefficient generator which produces multiplying coefficients,
 means for multiplying said first signals from said means by the multiplying coefficients to produce the feedback signal which is fed back,
 wherein at least one of said multiplying coefficients varies in its value as a function of time whereby said first signal is a frequency modulation signal.

BRIEF DESCRIPTION OF THE DRAWINGS

The invention will be explained in more detail in accordance with following drawings wherein.

DESCRIPTION OF THE PREFERRED EMBODIMENT

Before describing an FM modulator in an embodiment according to the invention, there will be explained a recursive digital filter on which the FM modulator of the invention is based.

Figure 1:
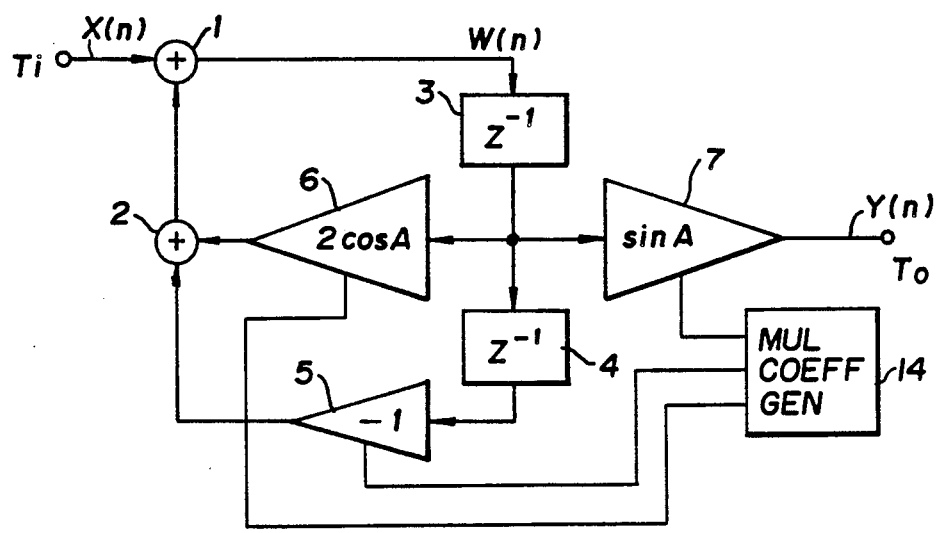
FIG. 1 is a block diagram showing a recursive digital filter on which an FM modulator according to the invention is based.

FIG. 1 shows the recursive digital filter which comprises a first adding circuit 1 to one of input terminals Ti of which an input impulse signal X(n) is applied (n=0,1,2 -----), a second adding circuit 2 for producing an output to be applied to the other input terminal of the first adding circuit 1, a first delaying circuit 3 for delaying an output W(n) of the first adding circuit 1 by a predetermined time, for instance, one clock signal, a second delaying circuit 4 for further delaying an output of the first delaying circuit 3 by a predetermined time, for instance, a further one clock signal, a multiplying circuit 5 for multiplying an output of the second delaying circuit 4 by a first multiplying coefficient "−1", a second multiplying circuit 6 for multiplying the output of the first delaying circuit 3 by a second multiplying coefficient "2cosA", and a third multiplying circuit 7 for multiplying the output of the first delaying circuit 3 by a third multiplying coefficient "sinA" to produce a fixed sine wave Y(n) at an output terminal To. A multiplying coefficient generator 14 is connected to provide multiplying coefficients to the multiplying circuits 5, 6, 7. The coefficients may be any values suitable for producing a frequency modulated output signal, such as those disclosed herein. The generator 14 may be any device suitable for storing or calculating the multiplying coefficients.

The fixed sine wave Y(n) is expressed in the equation (2).

$$Y(n) = \sin An = \frac{1}{2j}(e^{jAn} - e^{-jAn}) \quad (2)$$

The Z-conversion Y(Z) of the equation (2) is expressed in the equation (3).

$$Y(Z) = \frac{1}{2j} \sum_{n=-\infty}^{\infty} (e^{jAn} - e^{-jAn})Z^{-n} \qquad (3)$$

$$= \frac{\sin A}{1 - 2\cos A \cdot Z^{-1} + Z^{-2}}$$

FIG. 1 is a block diagram wherein the above mentioned circuits 1 to 7 are included in accordance with the equation (3). Therefore, the fixed sine wave Y(n) is produced at the output terminal To, when a predetermined level of the impulse signal X(n) is applied to the input terminal Ti.

In the recursive digital filter shown in FIG. 1, an amplitude of the fixed sine wave Y(n) is decided dependent on the parameter "sinA" of the multiplying circuit 7, while the outputs of the first adding circuit 1 and first delaying circuit 3 are respectively delayed by a delaying factor $Z^{-1}$ which is predetermined to delay the outputs thereof by a sampling period.

Figure 2:
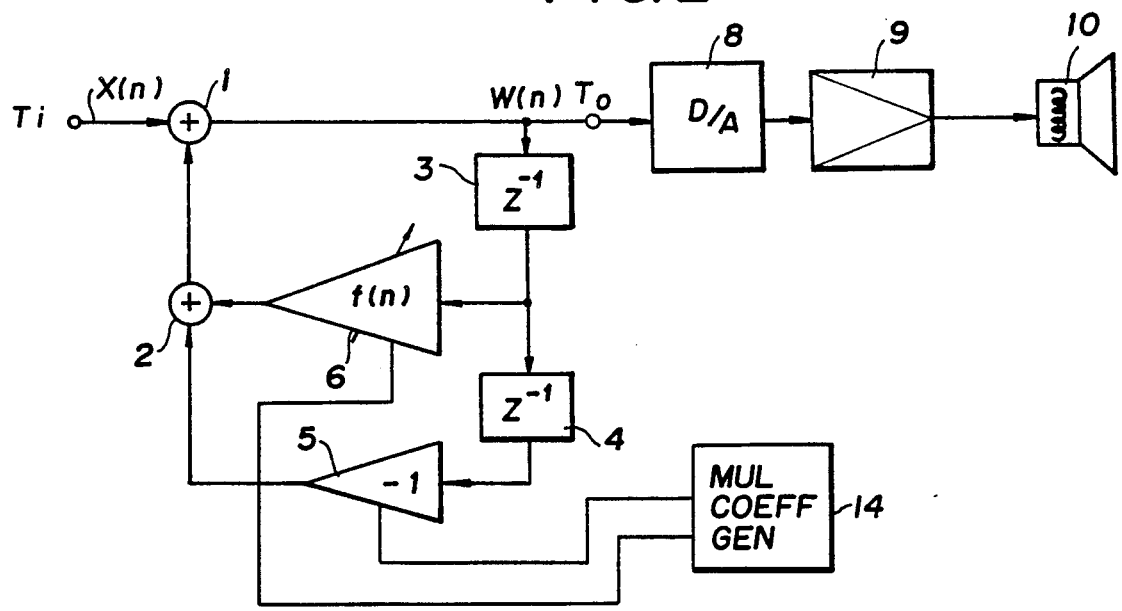
FIGS. 2 to 4 are block diagrams showing FM modulators in first to third embodiments according to the invention.

In FIG. 2, there is shown an FM modulator in a first embodiment according to the invention. The FM modulator comprises all of the circuit 1 to 6 except the multiplying circuit 7 shown in FIG. 1 wherein the second multiplying coefficient "2cosA" of the second multiplying circuit 6 is replaced by "f(n)" which is a function varying in regard to "time". As a result, such an FM modulator as shown in FIG. 2 which is defined only by the denominator of the equation (3), that is to say, $$\text{"} \frac{1}{1 - 2\cos A \cdot Z^{-1} + Z^{-2}} \text{"}$$

is obtained. At the output terminal To, a digital analog (D/A) converter 8 is provided to convert a digital frequency modulation wave into an analog signal. An amplifier 9 for amplifying an output signal of the D/A converter 8 is connected thereto, and a speaker 10 is connected to the amplifier 9.

Here, the relation between the function "f(n)" and output W(n) is expressed in the equation (4), $$W(n) + W(n-2) = f(n) \cdot W(n-1) \qquad (4)$$

The output "W(n)" is assumed to be as follows in accordance with the equation (1).

$$W(n) = \tilde{P}\sin[\tilde{\alpha}(n+1) + \tilde{I}\sin\tilde{\beta}(n+1)] \qquad (5)$$

In equation (5) and the equations that follow, P is an amplitude scaling factor, $\alpha$ is a carrier angular frequency, I is a modulation index, and $\beta$ is a modulating angular frequency. These parameters are given with tildes ($\sim$) for consistency with the assumption that W(n) is a frequency modulated wave.

Substituting the equation (5) for the equation (4), $$\tilde{P}\sin[\tilde{\alpha}(n+1) + \tilde{I}\sin\tilde{\beta}(n+1)] + \tilde{P}\sin[\tilde{\alpha}(n-1) + \qquad (6)$$
$$\tilde{I}\sin\tilde{\beta}(n-1)] = f(n)\,\tilde{P}\sin[\tilde{\alpha}n + \tilde{I}\sin\tilde{\beta}n]$$

The left side "L" of the equation (6) is modified as follows.

$$L = 2\tilde{P}\sin\left\{\tilde{\alpha}n + \frac{\tilde{I}}{2}[\sin\tilde{\beta}(n+1) + \sin\tilde{\beta}(n-1)]\right\} \cdot \qquad (7)$$
$$\cos\left\{\tilde{\alpha} + \frac{\tilde{I}}{2}[\sin\tilde{\beta}(n+1) - \sin\tilde{\beta}(n-1)]\right\}$$
$$= 2\tilde{P}\sin[\tilde{\alpha}n + \tilde{I}\sin\tilde{\beta}n \cdot \cos\tilde{\beta}] \cdot \cos[\tilde{\alpha} + \tilde{I}\cos\tilde{\beta}n \cdot \sin\tilde{\beta}]$$

If it is assumed that $\tilde{B} << 1$, there will be $\cos\tilde{\beta} \approx 1$, and $\sin\tilde{\beta} \approx \tilde{\beta}$ so that the equation (7) is as follows.

$$L = 2\tilde{P}\sin(\tilde{\alpha}n + \tilde{I}\sin\tilde{\beta}n) \cdot \cos(\alpha + \tilde{\beta}\tilde{I}\cos\tilde{\beta}n) \qquad (8)$$
$$= 2\tilde{P}\sin(\tilde{\alpha}n + \tilde{I}\sin\tilde{\beta}n) \times [\cos\alpha \cdot \cos(\tilde{\beta}\tilde{I}\cos\tilde{\beta}n) -$$
$$\sin\alpha \cdot \sin(\tilde{\beta}\tilde{I}\cos\tilde{\beta}n)]$$

In the equation (8), $\cos(\tilde{\beta}\tilde{I} \cdot \cos\tilde{\beta}n) \approx 1$, and $\sin(\tilde{\beta}\tilde{I}\cos\tilde{\beta}n) \approx \tilde{\beta}\tilde{I}\cos\tilde{\beta}n$ so that the equation (8) is as follows.

$$L \approx 2\tilde{P}\sin(\tilde{\alpha}n + \tilde{I}\sin\tilde{\beta}n) \cdot (\cos\tilde{\alpha} - \tilde{\beta}\tilde{I}\sin\tilde{\alpha}\cdot\cos\tilde{\beta}n) \qquad (9)$$

Comparing the equations (9) and (6), the function "f(n)" is as follows.

$$f(n) = 2(\cos\tilde{\alpha} - \tilde{\beta}\tilde{I}\sin\tilde{\alpha}\cdot\cos\tilde{\beta}n) \qquad (10)$$

The equation (10) is simplified as follows.

$$f(n) = 2(\cos A + B\cos Cn) \qquad (11)$$

where $$\cos\tilde{\alpha} = \cos A, \ \tilde{\beta} = C, \text{ and } \tilde{\beta}\tilde{I}\sin\tilde{\alpha} = -B\left(\tilde{I} = \frac{-B}{C\sin A}\right) \qquad (12)$$

In accordance with the equations (11) and (12), the constants A, B, C and P are calculated from an amplitude of the frequency modulation wave, angular frequency of a carrier thereof, modulation index thereof, and angular frequency thereof. The constants thus calculated are substituted for the constants in the following equations (13) and (14) by which impulse signal X(n) applied to the input terminal Ti is expressed.

(a) $n = 0$ (13)

$$X(0) = P\sin\left(A + \frac{B\sin C}{C\sin A}\right)$$

(b) $n \neq 0$ (14)

$$X(n) = 0$$

In accordance with the equation (11), further, the multiplying coefficient "f(n)" is calculated by the multiplying coefficient generator 14 at the time nT (T is a period of sampling time).

In operation, at the time nT of "0" (n=0), an impulse signal X(0) calculated in the equation (13) is applied to the input terminal Ti so that a frequency modulation wave $W(0) = P\sin(\alpha + I\sin\beta)$ is produced at the output terminal To in accordance with the equation(5).

At the time T, 2T, 3T—(n=1, 2, 3 —), impulse signals X(1), X(2), X(3)—of "0" based on the equation (14) are sequentially applied to the input terminal Ti so that frequency modulation waves $W(1) = \sin(2\alpha I\sin 2\beta)$, $W(2) = \sin(3\alpha + I\sin 3\beta)$, $W(3) = \sin(4\beta I\sin 4\beta)$—are sequentially produced at the output terminal To. Correspondingly, the multiplying coefficient "f(n)" is changed as follows.

$f(0) = 2(\cos A + B)$
$f(1) = 2(\cos A + B\cos C)$
$f(2) = 2(\cos A + B\cos 2C)$
$f(3) = 2(\cos A + B\cos 3C)$ The frequency modulation waves are supplied to the D/A converter 8 from which the converted analog signals are then supplied to the amplifier 9. The analog signals amplified in the amplifier 9 are supplied to the speaker 10 thereby producing sound.

The FM modulator shown in FIG. 2 can be included in a general purpose signal processor because the calculation, and generation of an impulse as described above can be easily performed therein. In addition, a recursive digital filter can be provided in a general purpose signal processor. Further, a large capacity of ROM is unnecessary to be included therein.

Figure 3:
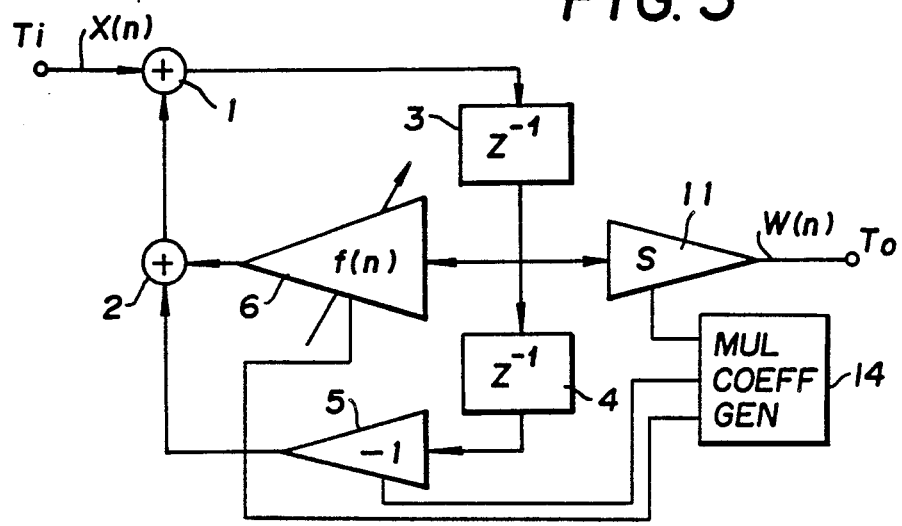

FIG. 3 shows an FM modulator in a second embodiment according to the invention wherein a multiplying circuit 11 having a multiplying coefficient "S" provided by the multiplying coefficient generator 14 is added to the FM modulator in the first embodiment.

In operation, an output of the delaying circuit 3 is partly supplied to the multiplying circuit 11 producing a frequency modulation wave W(n). The frequency modulation wave W(n) to be sampled at nT (=0, T, 2T -----) is calculated as follows.

$$W(n) \approx \frac{S}{\sin(A + I\sin C)} \cdot \sin(An + I\sin Cn) \quad (15)$$

At the time nT of "0" (n=0), an impulse having an amplitude of "1" is applied to the input terminal Ti so that a following output is produced at the output terminal To.

W(0)=0

The difference of the first and second embodiment is that an amplitude of the frequency modulation wave is calculated in the first embodiment by an amplitude of the impulse applied to the input terminal Ti, and an amplitude of the frequency modulation wave is calculated in the second embodiment by a multiplying coefficient of the multiplying circuit 11.

Figure 4:
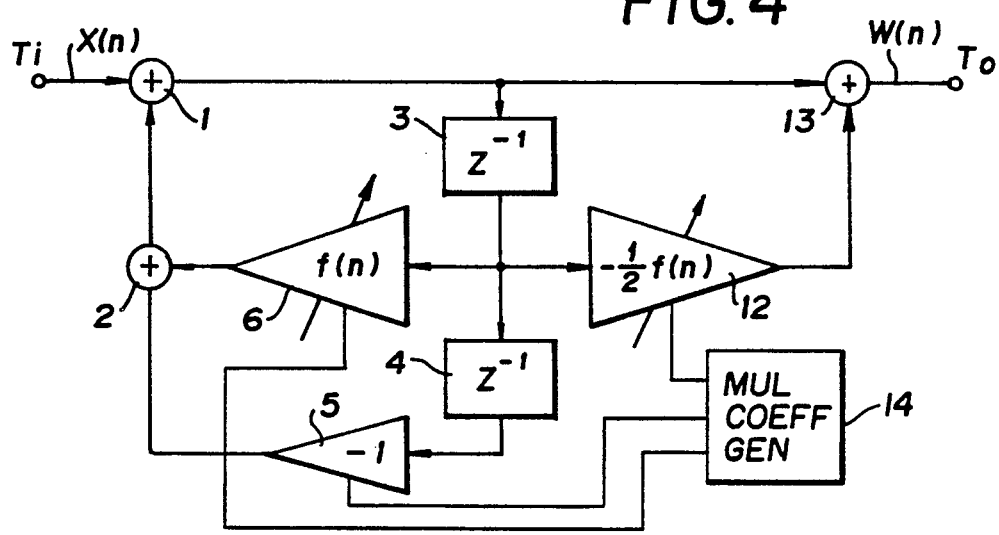

FIG. 4 shows an FM modulator in a third embodiment according to the invention wherein a multiplying circuit 12 having a multiplying coefficient of "−f(n)/2" provided by the multiplying coefficient generator 14 and adding circuit 13 for adding-outputs of the first delaying circuit 3 and multiplying circuit 12 are added to the FM modulator in the first embodiment.

In operation, an output of the first delaying circuit 3 is partly supplied to the multiplying circuit 12, and then outputs of the first adding circuit 1 and multiplying circuit 12 are added in the adding circuit 13 to produce a frequency modulation signal W(n) at the output terminal To.

Figure 5:
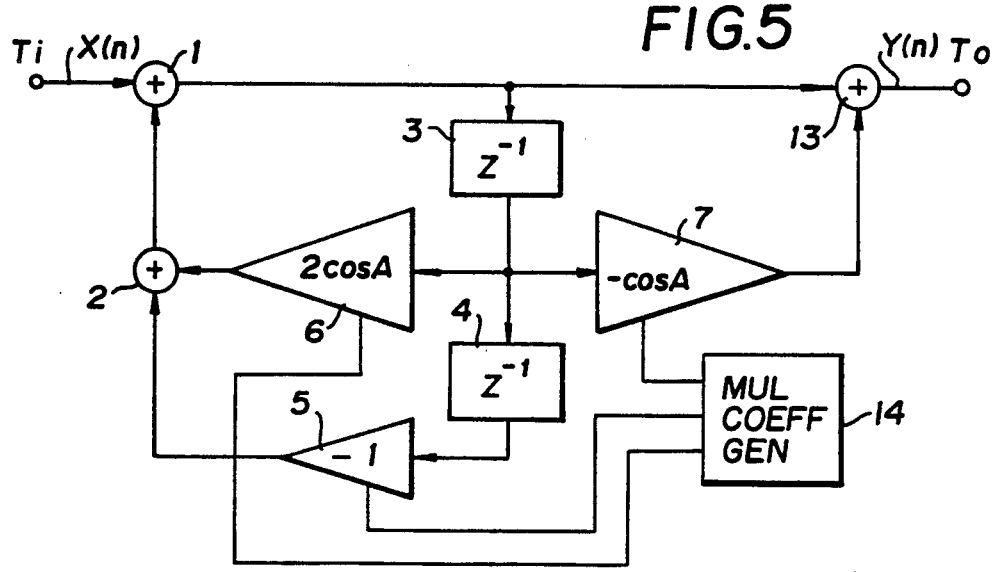
FIG. 5 is a block diagram showing another recursive digital filter on which an FM modulator according to the invention is based.

FIG. 5 shows a recursive digital filter on which the FM modulator in the third embodiment is based wherein like parts are indicated by like reference numerals.

A fixed cosine wave Y(n) to be sampled at the time nT is produced at the output terminal To as follows.

Y(n)=cosAn        (16)

The Z-conversion Y(z) of the equation (16) is expressed as follows.

$$Y(z) = \frac{1 - \cos A \cdot Z^{-1}}{1 - 2\cos A \cdot Z^{-1} + Z^{-2}} \quad (17)$$

The recursive digital filter shown in FIG. 5 is obtained in accordance with the equations (16) and (17), and further comprises an adding circuit 13 for adding outputs of the first adding circuit 1 and multiplying circuit 7 in addition to the construction of the recursive digital filter shown in FIG. 1, provided that a multiplying coefficient of the multiplying circuit 7 provided by the multiplying coefficient generator 14 is changed from "sinA" to "−cosA".

In operation, at the time nT of "0" (n=0), a cosine wave Y(n) a sampled value of which is expressed by the equation (16) is produced at the output terminal To, when an impulse signal X(n) an amplitude of which is "1" is applied to the input terminal Ti, that is to say, Y(0)=1.

In the FM modulator of the third embodiment in FIG. 4, the multiplying circuits 6 and 12 having multiplying coefficients "f(n)" and "−f(n)/2" respectively provided by the multiplying coefficient generator 14 are provided in place of the multiplying circuit 6 and 7 in FIG. 5.

In operation, at the time nT of "0" (n=0), a sample value W(0)≈1 is obtained in accordance with the equation (18), when an impulse signal X(0) of "1" is applied to the input terminal Ti.

W(n)≈cos(An+IsinCn)        (18)

As clearly understood from the equation (18), the signal W(n) is a frequency modulation wave to be expressed by a cosine wave.

As explained before, the amplitudes of the frequency modulation waves are calculated by the amplitude of the signal X(n) applied to the input terminal Ti in the first embodiment, and by the multiplying coefficient "s" of the multiplying circuit in the second embodiment. In the third embodiment, however, the amplitude of the frequency modulation wave is approximately equal to the amplitude of the impulse signal X(n) applied to the input terminal Ti.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. An FM modulator comprising:
   first means for adding an impulse input signal and a feedback signal to produce an added signal,
   means for delaying the added signal by predetermined times to produce first and second delaying signals,
   a multiplying coefficient generator which produces multiplying coefficients including a first multiplying coefficient which varies in value as a function of time and a second multiplying coefficient having a fixed value, means for multiplying the first and second delayed signals by the first and second multiplying coefficients, respectively, to produce first and second multiplied signals, respectively, and second means for adding the first and second multiplied signals to produce the feedback signal, whereby the added signal is a frequency modulation signal.

2. An FM modulator according to claim 1 wherein said means for delaying includes a first means for delaying the added signal by a first predetermined time to produce the first delayed signal and a second means for delaying the first delayed signal by a second predetermined time to produce the second delayed signal, and said means for multiplying includes a first means for multiplying the first delayed signal by the first multiplying coefficient to produce the first multiplied signal and a second means for multiplying the second delayed signal by the second multiplying coefficient to produce the second multiplied signal, the second means for adding being connected to receive and add the first and second multiplied signals, the sum of the first and second multiplied signals being the feedback signal.

3. An FM modulator comprising:

first means for adding an impulse input signal and a feedback signal to produce an added signal, means for delaying the added signal by predetermined times to produce first and second delayed signals, a multiplying coefficient generator which produces multiplying coefficients including first and second multiplying coefficients which vary in value as functions of time and a third multiplying coefficient having a fixed value, first means for multiplying the first and second delayed signals by the first and third multiplying coefficients, respectively, to produce first and second multiplied signals, respectively, the first means for multiplying being connected to receive the first and third multiplying coefficients from the multiplying coefficient generator, second means for adding the first and second multiplied signals to produce the feedback signal, and second means for multiplying the first delayed signal by the second multiplying coefficient to produce a frequency modulation signal.

4. An FM modulator according to claim 3 wherein said means for delaying includes a first means for delaying the added signal by a first predetermined time to produce the first delayed signal and a second means for delaying the first delayed signal by a second predetermined time to produce the second delayed signal, said first multiplying means includes a third means for multiplying the first delayed signal by the first multiplying coefficient to produce the first multiplied signal and a fourth means for multiplying the second delayed signal by the third multiplying coefficient to produce the second multiplied signal, and said second means for adding is connected to receive the first and second multiplied signals.

5. An FM modulator comprising:

first means for adding an impulse input signal and a feedback signal to produce an added signal, means for delaying the added signal by predetermined times to produce first and second delayed signals, a multiplying coefficient generator which produces multiplying coefficients including first and second multiplying coefficients which vary in value as a function of time and a third multiplying coefficient having a fixed value, first and second means for multiplying the first and third multiplying coefficients, respectively, to produce first and second multiplied signals, respectively, the first and second means for multiplying being connected to receive the first and third multiplying coefficients, respectively, from the multiplying coefficient generator, second means for adding the first and second multiplied signals to produce the feedback signal, third means for multiplying the first delayed signal by the second multiplying coefficient to produce a third multiplied signal, and third means for adding the added signal and the third multiplied signal to produce a frequency modulated signal 6. An FM modulator according to claim 5 wherein said means for delaying includes a first means for delaying the added signal by a first predetermined time to produce the first delayed signal and a second means for delaying the first delayed signal by a second predetermined time to produce a second delayed signal.

7. An FM modulator comprising:

a first adder for adding an impulse input signal and a feedback signal to produce an added signal;

a multiplying coefficient generator for generating first, second, and fourth multiplying coefficients;

a first delaying circuit connected to receive and delay said added signal by a first predetermined delaying time to produce a first delayed signal at an output thereof;

a first multiplier connected to receive and multiply said first delayed signal by the first multiplying coefficient having a value which varies as a function of time $f(n) = 2(\cos A + B \cos Cn)$, where A is an amplitude of a frequency modulated wave, B is an angular frequency of a carrier of a frequency modulated wave, and C is a modulation index thereof, generated in said multiplying coefficient generator to produce a first multiplied signal at an output thereof;

a second delaying circuit connected to receive and delay said first delayed signal by a second predetermined delaying time to produce a second delayed signal at an output thereof;

a second multiplier connected to receive and multiply said second delayed signal by the second multiplying coefficient having a fixed value $-1$ generated in said multiplying coefficient generator to produce a second multiplied signal at an output thereof;

a second adder connected to receive and add said first and second multiplied signals to produce said feedback signal at an output thereof;

a fourth multiplier connected to receive and multiply said first delayed signal by the fourth multiplying coefficient having a value which various as a function of time $\frac{1}{2} f(n)$ generated in said multiplying coefficient generator to produce a fourth multiplied signal at an output thereof; and a third adder connected to receive and add said added signal supplied from said first adder and said fourth multiplied signal supplied from said fourth multiplier to produce a frequency modulation wave.

8. An FM modulator comprising:
a first adder for adding an impulse input signal and a feedback signal to produce an added signal;
a multiplying coefficient generator for generating first and second multiplying coefficients;
a first delaying circuit connected to receive and delay said added signal by a first predetermined delaying time to produce a first delayed signal at an output thereof;
a first multiplier connected to receive and multiply said first delayed signal by the first multiplying coefficient having a value which various as a function of time $f(n)=2(\cos A+B\cos Cn)$, where A is an amplitude of a frequency modulated wave, B is an angular frequency of a carrier of a frequency modulated wave, and C is a modulation index thereof, generated in said multiplying coefficient generator to produce a first multiplied signal;
a second delaying circuit connected to receive and delay said first delayed signal by a second predetermined delaying time to produce a second delayed signal at an output thereof;
a second multiplier connected to receive and multiply said second delayed signal by the second multiplying coefficient having a fixed value $-1$ generated in said multiplying coefficient generator to produce a second multiplied signal at an output thereof; and
a second adder connected to receive and add said first and second multiplied signals to produce said feedback signal;
wherein said added signal of said first adder produces a frequency modulation wave in accordance with the summation of said input impulse signal.

9. An FM modulator comprising:
a first adder for adding an impulse input signal and a feedback signal to produce an added signal;
a multiplying coefficient generator for generating first, second, and third multiplying coefficients;
a first delaying circuit connected to receive and delay said added signal by a first predetermined delaying time to produce a first delayed signal at an output thereof;
a first multiplier connected to receive and multiply said first delayed signal by the first multiplying coefficient having a value which varies as a function of time $f(n)=2(\cos A+B\cos Cn)$, where A is an amplitude of a frequency modulated wave, B is an angular frequency of a carrier of a frequency modulated wave, and C is a modulation index thereof, generated in said multiplying coefficient generator to produce a first multiplied signal at an output thereof;
a second delaying circuit connected to receive and delay said first delayed signal by a second predetermined delaying time to produce a second delayed signal at an output thereof;
a second multiplier connected to receive and multiply said second delayed signal by the second multiplying coefficient having a fixed value $-1$ generated in said multiplying coefficient generator to produce a second multiplied signal at an output thereof;
a second adder connected to receive and add said first and second multiplied signals to produce said feedback signal at an output thereof; and
a third multiplier connected to receive and multiply said first delayed signal by the third multiplying coefficient having a value which varies as a function of time $S(n)$ is generated in said multiplying coefficient generator, said third multiplier producing a frequency modulation wave at an output thereof.

* * * * *

UNITED STATES PATENT AND TRADEMARK OFFICE
CERTIFICATE OF CORRECTION

PATENT NO. : 5,003,504
DATED : MARCH 26, 1991
INVENTOR(S) : YAZAWA ET AL

It is certified that error appears in the above-identified patent and that said Letters Patent is hereby corrected as shown below:

Column 8, line 6, after "first" (second occ.) insert --and second delayed signals, respectively, by the first and--;

Column 8, line 20, after "signal" insert --.--;

Column 8, line 61, change "various" to --varies--;

Column 8, line 62, change "1/2" to -- -1/2 --;

Column 9, line 12, change "various" to --varies--.

Signed and Sealed this

First Day of September, 1992

Attest:

DOUGLAS B. COMER

*Attesting Officer*  *Acting Commissioner of Patents and Trademarks*